United States Patent
Zhang

(10) Patent No.: US 11,362,148 B2
(45) Date of Patent: Jun. 14, 2022

(54) QUANTUM DOT DISPLAY PANEL AND MANUFACTURING METHOD THEREOF

(71) Applicant: Shenzhen China Star Optoelectronics Semiconductor Display Technology Co., Ltd., Shenzhen (CN)

(72) Inventor: Liangfen Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 231 days.

(21) Appl. No.: 16/756,085

(22) PCT Filed: Mar. 27, 2020

(86) PCT No.: PCT/CN2020/081561
§ 371 (c)(1),
(2) Date: Apr. 14, 2020

(87) PCT Pub. No.: WO2021/174615
PCT Pub. Date: Sep. 10, 2021

(65) Prior Publication Data
US 2022/0037411 A1     Feb. 3, 2022

(30) Foreign Application Priority Data
Mar. 5, 2020   (CN) .......................... 202010145352.1

(51) Int. Cl.
*H01L 27/32* (2006.01)
*B41M 3/00* (2006.01)
*B41M 5/00* (2006.01)
*B41M 7/00* (2006.01)
*H01L 25/16* (2006.01)
*H01L 51/52* (2006.01)

(52) U.S. Cl.
CPC .......... *H01L 27/322* (2013.01); *B41M 3/003* (2013.01); *B41M 5/0047* (2013.01); *B41M 7/0081* (2013.01); *H01L 25/167* (2013.01); *H01L 51/5284* (2013.01); *H01L 27/3244* (2013.01)

(58) Field of Classification Search
None
See application file for complete search history.

(56) References Cited

U.S. PATENT DOCUMENTS

| | | | |
|---|---|---|---|
| 2019/0025634 A1* | 1/2019 | Park | H01L 27/322 |
| 2020/0295310 A1* | 9/2020 | Moon | H01L 27/3246 |
| 2020/0395416 A1* | 12/2020 | Bae | H01L 51/5284 |
| 2021/0095193 A1* | 4/2021 | Hyung | C08L 75/04 |
| 2021/0336171 A1* | 10/2021 | Peng | H01L 51/56 |

* cited by examiner

*Primary Examiner* — Nduka E Ojeh
(74) *Attorney, Agent, or Firm* — Kirton McConkie; Evan R. Witt

(57) ABSTRACT

The present invention provides a quantum dot display panel and a manufacturing method thereof. The present invention includes a pixel definition layer on a surface of a color film substrate, a quantum dot photoconversion film located on pixel definition regions of the pixel definition layer, and a blue light display device located under the quantum dot photoconversion film. An uplift layer and a light-shielding layer are arranged in the pixel definition layer to ensure that a thickness of the pixel definition layer is greater than or equal to 6 μm, which is beneficial to uniform curing of quantum dots in the quantum dot photoconversion film.

18 Claims, 3 Drawing Sheets

QUANTUM DOT DISPLAY PANEL AND MANUFACTURING METHOD THEREOF

FIELD OF INVENTION

The present disclosure relates to the field of display technology, and more particularly, to a quantum dot display panel and a manufacturing method thereof.

BACKGROUND OF INVENTION

With booming development of display technology, high color gamut has become an important development direction. High color gamut means that display screens are more colorful and have stronger color display capabilities. Quantum dot (QD) display technology is an innovative semiconductor nanocrystal technology, which can accurately transmit light, efficiently improve color gamut value and viewing angles of display panels, allow colors to be purer and brighter, and allow color performance to be more encompassing. Display devices using the technology thereof can not only generate dynamic colors with a wider color gamut, but also display real color plates in definition, surpassing traditional backlight technology With rapid development of flexible curved touch display technology, technological updates in related fields are also rapidly changing. For example, organic light-emitting diodes (OLEDs) refer to diodes that use organic semiconductor materials and light-emitting materials to emit light through carrier injection and recombination under drive of an electric field. QD-OLED display panels combine OLED electroluminescence technology and quantum dot (QD) photoluminescence technology, and include an OLED array substrate that emits blue light, a quantum dot photoconversion film, and a color filter (CF). QD-OLED display panels use blue OLED as light source to excite red quantum dots and green quantum dots in the quantum dot photoconversion film. After receiving the blue light, the red quantum dots will excite red light through the color filter. After receiving the blue light, the green quantum dots will excite green light through the color filter. The blue light will pass directly through the color filter, resulting in a full-color display. Therefore, QD-OLED display panels have excellent performance such as wide color gamut and wide-viewing angles, and are considered as potential technologies for large-sized OLEDs.

In current preparation process of photoconversion films, quantum dot particles need to be made into ink droplets, which are ink-jetted into corresponding pixel definition regions and then cured by heating or ultraviolet light. Black hydrophobic materials with strong light-shielding ability are set on both sides of the pixel definition regions, which causes a bottom layer of quantum dot particles to be incompletely cured. An interval is defined between the sides of the pixel definition regions, which affects light conversion efficiency and brightness of quantum dot particle photoconversion films. Under condition of wider viewing angles, luminescence spectrum and brightness observed from all directions greatly vary with observation angles, resulting in technical problems of poor color deviation and brightness of wider viewing angles which affect display quality and need to be solved.

SUMMARY OF INVENTION

The present disclosure provides a quantum dot display panel and a manufacturing method thereof which can solve the technical problems affecting display quality. The technical problems in current preparation process of photoconversion films are that quantum dot particles need to be made into ink droplets, and ink-jetted into corresponding pixel definition regions, and then cured by heating or ultraviolet light. Black hydrophobic materials with strong light-shielding ability are set on both sides of the pixel definition regions, which causes a bottom of quantum dot particles to be incompletely cured. An interval is defined between the sides of the pixel definition regions, which affects light conversion efficiency and brightness of quantum dot particle photoconversion films. Under the condition of greater-viewing angles, luminescence spectrum and brightness observed from all directions greatly vary with observation angles, resulting in technical problems of poor color deviation and brightness of greater-viewing angles.

In order to solve the above problem, the present disclosure provides technical solutions as follows:

The present disclosure further provides a quantum dot display panel. The quantum dot display panel comprises a color film substrate comprising a base substrate and a color resistance layer located on a surface of the base substrate, the color resistance layer is divided into a red, green, and blue (RGB) color resistance, and no black matrix is set between adjacent RGB color resistances. A pixel definition layer comprises an uplift layer and a light-shielding layer covering the uplift layer, and a lamination layer of the uplift layer and the light-shielding layer is located between the adjacent RGB color resistances and arranged opposite to the RGB color resistance to form pixel definition regions in an array. A quantum dot photoconversion film is formed in the pixel definition regions. An array substrate and a blue light display device located on the array substrate, wherein the color film substrate and the array substrate are arranged in pairs, and the blue light display device is arranged opposite to the quantum dot photoconversion film.

According to a preferred embodiment of the present disclosure, the quantum dot display panel is a top emission structure, and the color film substrate, the quantum dot photoconversion film, the blue light display device, and the array substrate are sequentially disposed along a light-emitting direction.

According to a preferred embodiment of the present disclosure, the uplift layer is a SiN film, a SiO film, or an organic film, and the light-shielding layer is a black matrix.

According to a preferred embodiment of the present disclosure, a thickness of the lamination layer of the uplift layer and the light-shielding layer is greater than or equal to 6 μm.

According to a preferred embodiment of the present disclosure, a cross-section of the pixel definition regions is an isosceles trapezoid, and the quantum dot photoconversion film is attached to two sides of the isosceles trapezoid.

According to a preferred embodiment of the present disclosure, each of the RGB color resistance on the quantum dot display panel and corresponding light-emitting layers of the blue light display device thereof define a sub-pixel.

According to a preferred embodiment of the present disclosure, the color resistance layer is the B color resistance, and the quantum dot photoconversion film corresponding to the B color resistance is set without quantum dot particles.

According to a preferred embodiment of the present disclosure, an organic protection layer is disposed between the color film substrate and the pixel definition layer, and the organic protection layer is made of a transparent organic film or an optically transparent adhesive.

According to a preferred embodiment of the present disclosure, the blue light display device is an organic light-emitting diode (OLED) display device or a mini light-emitting diode (mini-LED) display device.

In order to achieve the above purpose, the present disclosure further provides a quantum dot display panel. The quantum dot display panel comprises a color film substrate comprising a base substrate and a color resistance layer located on a surface of the base substrate, the color resistance layer is divided into a red, green, and blue (RGB) color resistance, and no black matrix is set between adjacent RGB color resistances. A pixel definition layer disposed on a surface of the color film substrate and arranged opposite to the RGB color resistance to form pixel definition regions in an array. A quantum dot photoconversion film formed in the pixel definition regions. Wherein, the pixel definition layer comprises an uplift layer and a light-shielding layer covering the uplift layer, and a lamination layer of the uplift layer and the light-shielding layer is located between the adjacent RGB color resistances.

According to a preferred embodiment of the present disclosure, the quantum dot display panel comprises an array substrate and a blue light display device located on the array substrate, the color film substrate and the array substrate are arranged in pairs, and the blue light display device is arranged opposite to the quantum dot photoconversion film.

According to a preferred embodiment of the present disclosure, the blue light display device is an organic light-emitting diode (OLED) display device or a mini light-emitting diode (mini-LED) display device.

According to a preferred embodiment of the present disclosure, the quantum dot display panel is a top emission structure, and the color film substrate, the quantum dot photoconversion film, the blue light display device, and the array substrate are sequentially disposed along a light-emitting direction.

According to a preferred embodiment of the present disclosure, a thickness of the lamination layer of the uplift layer and the light-shielding layer is greater than or equal to 6 μm.

According to a preferred embodiment of the present disclosure, a cross-section of the pixel definition regions is an isosceles trapezoid, and the quantum dot photoconversion film is attached to two sides of the isosceles trapezoid.

According to a preferred embodiment of the present disclosure, each of the RGB color resistance on the quantum dot display panel and corresponding light-emitting layers of the blue light display device thereof define a sub-pixel.

According to a preferred embodiment of the present disclosure, the color resistance layer is the B color resistance, and the quantum dot photoconversion film corresponding to the B color resistance is set without quantum dot particles.

According to a preferred embodiment of the present disclosure, an organic protection layer is disposed between the color film substrate and the pixel definition layer, and the organic protection layer is made of a transparent organic film or an optically transparent adhesive.

According to the above quantum dot display panel, the present disclosure further provides a manufacturing method of a quantum dot display panel comprising following steps:

Step 1: providing a base substrate, forming a color resistance layer on the base substrate, and completing a preparation of a color film substrate.

Step 2: forming a pixel definition layer on the color film substrate, defining the pixel definition layer as an interval to form pixel definition regions, ink droplet printing quantum dot particles into the pixel definition regions by inkjet printing technology, curing thereof by ultraviolet light, and completing a preparation of a quantum dot photoconversion film.

Step 3: attaching the quantum dot photoconversion film on a corresponding blue light display device and a surface of an array substrate.

According to a preferred embodiment of the present disclosure, the step 2 of forming the pixel definition layer on the color film substrate, defining the pixel definition layer as the interval to form the pixel definition regions, ink droplet printing the quantum dot particles into the pixel definition regions by inkjet printing technology, curing thereof by ultraviolet light, and completing the preparation of the quantum dot photoconversion film comprises that forming an uplift layer and a light-shielding layer covering the uplift layer on a surface of the color film substrate, and laminating the uplift layer and the light-shielding layer to form a pixel definition layer, wherein a thickness of the pixel definition layer is greater than or equal to 6 μm.

The present disclosure provides a quantum dot display panel and a manufacturing method thereof. The quantum dot display panel in the present disclosure comprises a color film substrate, a pixel definition layer located on a surface of the color film substrate, a quantum dot photoconversion film located in pixel definition regions of the pixel definition layer, and a blue light display device located under the quantum dot photoconversion film. Because the pixel definition layer is set with an uplift layer and a light-shielding layer, a thickness of the pixel definition layer is ensured to be greater than or equal to 6 μm, which is beneficial to uniform curing of quantum dots in the quantum dot photoconversion film and seamlessly fit on sides of the pixel definition layer, and prevents the quantum dot display panel from light mixing and light leakage. Blue light source emitted from the blue light display device excites the quantum dot photoconversion film to emit pure light, and the pure light passes through color resistance and becomes corresponding colors, resulting in achieving a softer, more uniform, and brighter output light and increasing color gamut and viewing angles of display devices, thereby improving display quality of the quantum dot display panel.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the adopted directional terms are used to describe and understand the present disclosure, but the present disclosure is not limited thereto. In figures, elements with similar structures are indicated by the same numbers. Dotted lines in the figure are indicated that it does not exist in structure, only shape and position of the structure are explained.

The present disclosure is directed at technical problems affecting display quality. The technical problems in current preparation process of photoconversion films are that quantum dot particles need to be made into ink droplets, which are ink-jetted into corresponding pixel definition regions and then cured by heating or ultraviolet light. Black hydrophobic materials with strong light-shielding ability are set on both sides of the pixel definition regions, which causes a bottom layer of quantum dot particles to be incompletely cured. An interval is defined between the sides of the pixel definition regions, which affects light conversion efficiency and brightness of quantum dot particle photoconversion films. Under the condition of wider viewing angles, luminescence spectrum and brightness observed from all directions greatly vary with observation angles, resulting in technical problems of poor color deviation and brightness of wider viewing angles. The present embodiment can solve the defects.

Figure 1:
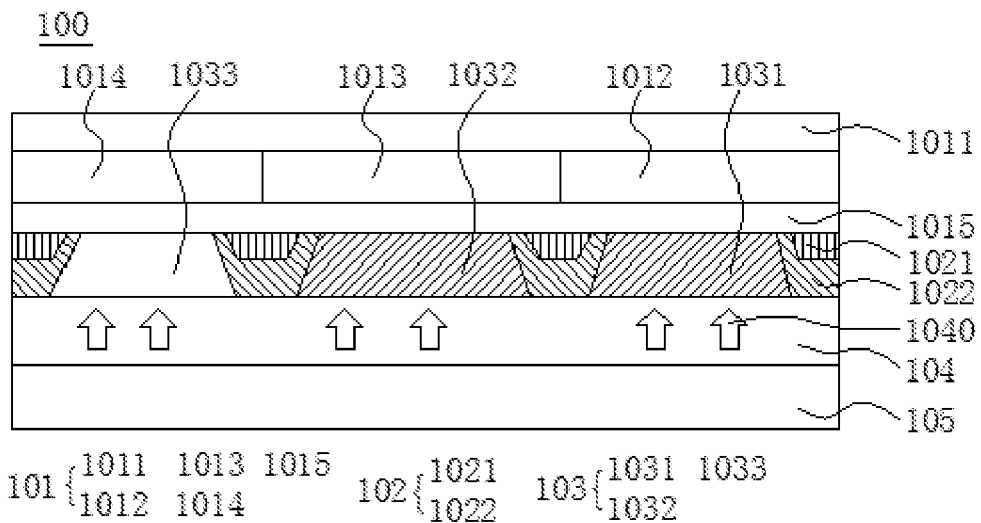
FIG. 1 is a schematic structural diagram of a quantum dot display panel provided by the present disclosure.

As shown in FIG. 1, the present disclosure provides a quantum dot display panel 100, and the quantum dot display panel 100 comprises a color film substrate 101 comprising a base substrate 1011 and a color resistance layer located on a surface of the base substrate 1011. The color resistance layer is divided into a red, green, and blue (RGB) color resistance; for example, the color resistance layer comprises a red sub-color resistance 1012, a green sub-color resistance 1013, and a blue sub-color resistance 1014, and no black matrix is set between any two adjacent RGB color resistances. An organic protection layer 1015 is disposed on the color resistance layer away from the base substrate 1011, and the organic protection layer is made of a transparent organic film or an optically transparent adhesive. A pixel definition layer is disposed on a surface of the color film substrate 101 and arranged opposite to the RGB color resistance to form pixel definition regions in an array. A cross-section of the pixel definition regions is preferably an isosceles trapezoid. The pixel definition layer 102 comprises an uplift layer 1021 and a light-shielding layer 1022 covering the uplift layer 1021, and a lamination layer of the uplift layer 1021 and the light-shielding layer 1022 is located between the adjacent RGB color resistances. A quantum dot photoconversion film 103 is formed in the pixel definition regions; for example, the quantum dot photoconversion film 103 comprises a first quantum dot photoconversion film 1031, a second quantum dot photoconversion film 1032, and a third quantum dot photoconversion film 1033. The first quantum dot photoconversion film 1031, the second quantum dot photoconversion film 1032, and the third quantum dot photoconversion film 1033 all are disposed in the pixel definition regions and attached on both sides of the pixel definition layer 102. The third quantum dot photoconversion film 1033 is arranged opposite to the blue sub-color resistance 1014. The third quantum dot photoconversion film 1033 is vacant and is set without quantum dot particles.

The quantum dot display panel 100 further comprises an array substrate 105 and a blue light display device 104 located on the array substrate 105. The color film substrate 101 and the array substrate 105 are arranged in pairs, and the blue light display device 104 is arranged opposite to the quantum dot photoconversion film 103. The blue light display device 104 is preferably an organic light-emitting diode (OLED) display device or a mini light-emitting diode (mini-LED) display device. The quantum dot display panel 100 is a top emission structure, and the color film substrate 101, the quantum dot photoconversion film 103, the blue light display device 104, and the array substrate 105 are sequentially disposed along a light-emitting direction. In the quantum dot OLED display panel 100, each of the RGB color resistances on the quantum dot display panel and corresponding light-emitting layers of the blue light display device thereof define a sub-pixel. A spectrum of the color film substrate, an emission spectrum of the quantum dot photoconversion film, and a spectrum of the light-emitting layer corresponding to same sub-pixel are basically coincided. Blue light source emitted from the blue light display device 104 excites the quantum dot photoconversion film 103 to emit pure light, and the pure light passes through color resistance and becomes corresponding colors, resulting in achieving a softer, more uniform, and brighter output light and increasing color gamut and viewing angles of display devices, thereby improving display quality of the quantum dot display panel.

Specifically, in the present embodiment, the pixel definition layer 102 is defined as an interval to form a plurality of pixel definition regions, the pixel definition regions are filled with the quantum dot particles to form the quantum dot photoconversion film 103, and the pixel definition regions are arranged opposite to the RGB color resistance in the color resistance layer 1017. If the pixel definition layer 102 is set in one layer, and the pixel definition layer 102 is all made of black light-shielding hydrophobic material, the pixel definition layer 102 cannot reach 6 μm. When the quantum dot particles are dripped into the pixel definition regions and cured by heating or ultraviolet light, solidification speed of the quantum dot particles at a bottom of the pixel definition regions is different from solidification speed of the quantum dot particles on a surface of the pixel definition regions, so that an interval is defined between the bottom of the quantum dot particles and the sides or the bottom of the pixel definition regions, which affects light conversion efficiency and brightness of the quantum dot particle photoconversion films. Therefore, in the present embodiment, the pixel definition layer 102 is formed in two layers, comprising the uplift layer 1021 and the light-shielding layer 1022 covering the uplift layer 1021. The light-shielding layer 1022 has a same patterned shape as the uplift layer 1021, and the light-shielding layer 1022 covers the uplift layer 1021 to prevent light leakage of the quantum dot photoconversion film 103, as well as facilitates a thickness of a lamination layer of the uplift layer 1021 and the light-shielding layer 1022 to be greater than or equal to 6 μm. The uplift layer 1021 is a SiN film, a SiO film, or an organic film, and the light-shielding layer 1022 is a black matrix, which is beneficial to uniform curing of quantum dots in the quantum dot photoconversion film and seamlessly fit on the sides of the pixel definition layer, and prevents the quantum dot display panel 100 from light mixing and light leakage.

Figure 2:
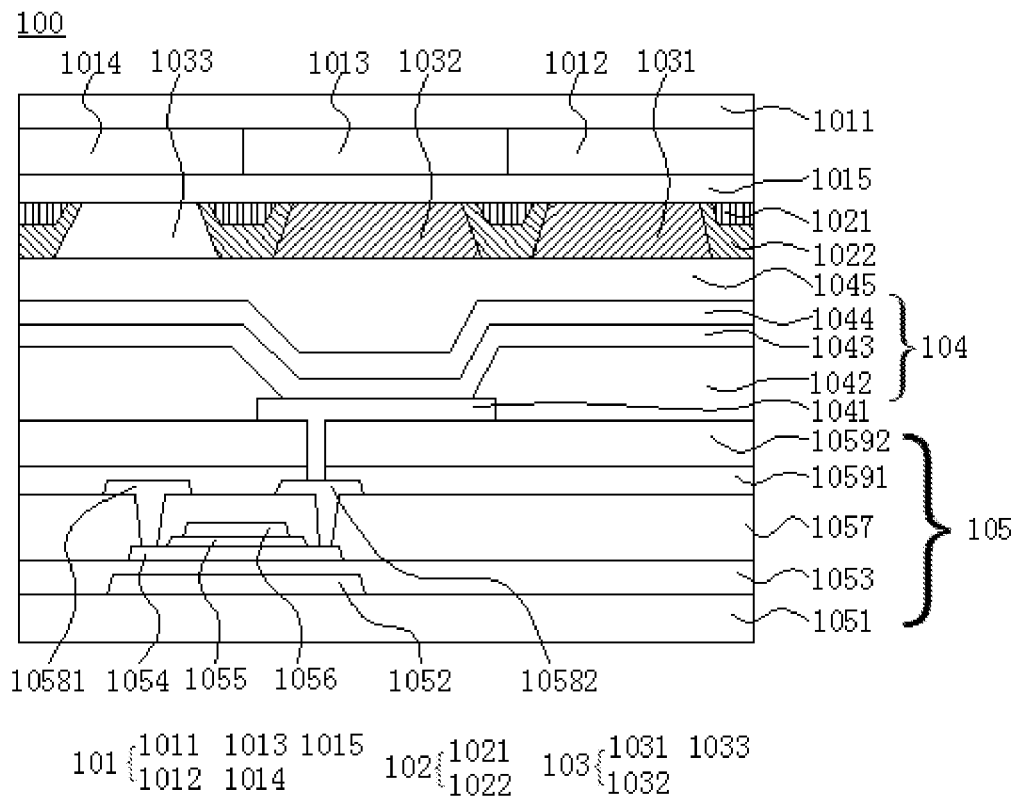
FIG. 2 is a schematic structural diagram of an organic light-emitting diode (OLED) display panel provided by the present disclosure.

As shown in FIG. 2, the quantum dot display panel 100 in the present disclosure comprises the color film substrate 101, the pixel definition layer 102 located on a surface of the color film substrate 101, the quantum dot photoconversion film 103 located in pixel definition regions of the pixel definition layer, the blue light display device 104 located under the quantum dot photoconversion film 103. The blue light display device 104 is an organic light-emitting diode (OLED) display device or a mini light-emitting diode (mini-LED) display device, and the blue light display device 104 emits light 1040. The array substrate 105 is a thin film transistor (TFT) substrate, and the array substrate 105 comprises a second substrate 1051 and a TFT layer disposed on a surface of the second substrate. The second substrate 1051 is preferably a glass substrate or a transparent plastic substrate. The TFT layer located on the surface of the second substrate comprises a second light-emitting layer 1052 disposed on the second substrate 1051, a buffer layer 1053 disposed on the second substrate 1051 and covering the second light-emitting layer 1052, an active layer 1054 disposed on the buffer layer 1053, a gate insulation layer 1055 disposed on the active layer 1054, a gate 1056 disposed on the gate insulation layer 1055, an interlayer insulation layer 1057 disposed on the buffer layer 1053 and covering the active layer 1054, the gate insulation layer 1055, and the gate 1056, a source 10581 and a drain 10582 disposed on the interlayer insulation layer 1057, a passivation layer 10591 disposed on the interlayer insulation layer 1057 and covering the source 10581 and the drain 10582, and a planarization layer 10592 disposed on the second interlayer insulation layer 1094 and the passivation layer 10591. Wherein, the active layer 1054 comprises a channel region corresponding to the gate 1056, and a source contact region and a drain contact region respectively located on both sides of the channel region, the source contact region and the drain contact region are conductive metal oxide semiconductor materials, and the channel region is made of a metal oxide semiconductor material that maintains semiconductor characteristics. A source contact hole and a drain contact hole respectively corresponding to the source contact region and the drain contact region define on the interlayer insulation layer 1057, and the source 10581 and the drain 10582 are respectively electrically connected to the source contact region and the drain contact region of the active layer 1054 through the source contact hole and the drain contact hole. An orthographic projection of the second light-shielding layer 1052 on the second substrate 1051 covers an orthographic projection of the active layer 1052 on the second substrate 1051, so that the second light-shielding layer 1052 can completely cover the active layer 1054 and prevent the active layer 1054 from being irradiated with light, thereby preventing negative drift of threshold voltage of the TFT layer.

The blue light display device 104 is located on the TFT layer and comprises an anode layer 1041, a second pixel definition layer 1042 located on the anode layer 1041, a light-emitting layer 1043 located on a surface of the second pixel definition layer 1042, a cathode layer 1044 located on a surface of the light-emitting layer 1043, and a packaging layer 1045 disposed on the cathode layer 1044 away from the TFT layer. The quantum dot photoconversion film 103 is attached to the packaging layer 1045. The pixel definition layer 1042 is separately arranged to form a pixel opening, and a portion of the light-emitting layer 1043 corresponding to the pixel opening is tiled on the anode layer 1041. The anode 1041 is electrically connected to the drain 10582 of the TFT layer through an anode through-hole. The source 10581 of the TFT layer is connected to a positive electrode of external power supply. The cathode layer 1044 is electrically connected to a negative electrode of external power supply through a power supply wiring layer. When a direct current voltage ranging from 2V to 10V is set between the anode 1041 and the cathode layer 1044, the anode 1041 generates holes, the cathode layer 1044 generates electrons, and they meet in the light-emitting layer 1043. The electrons and the holes are respectively negative and positive, and they attract each other and excite organic materials in the light-emitting layer 1043 to emit light, so as to achieve normal operation of the quantum dot OLED display panel. Brightness of the light-emitting layer 1043 can be adjusted by the voltage between the anode 1041 and the cathode layer 1044; that is, greater voltage is greater brightness, and vice versa. According to different formulas, three primary colors of red, green, and blue (R, G, B) are produced to form the basic colors. In the present embodiment, the light-emitting layer 1043 preferably emits blue light. Blue light is more able to excite efficiency and brightness of quantum dot conversion light in the quantum dot photoconversion film 103.

In another embodiment, the blue light display device 104 is a liquid crystal display device, and a corresponding liquid crystal display panel and a corresponding backlight module are arranged under the quantum dot photoconversion film.

Figure 3:
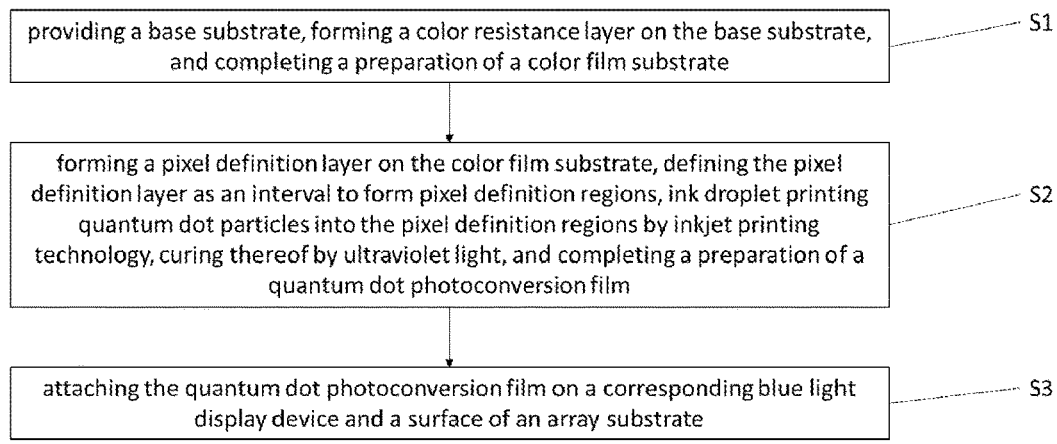
FIG. 3 is a schematic preparation flowchart of the quantum dot display panel provided by the present disclosure.

According to the above quantum dot display panel, as shown in FIG. 3, the present disclosure further provides a manufacturing method of a quantum dot display panel comprising following steps:

Step 1 S1: providing a base substrate, forming a color resistance layer on the base substrate, and completing a preparation of a color film substrate.

Step 2 S2: forming a pixel definition layer on the color film substrate, defining the pixel definition layer as an interval to form pixel definition regions, ink droplet printing quantum dot particles into the pixel definition regions by inkjet printing technology, curing thereof by ultraviolet light, and completing a preparation of a quantum dot photoconversion film.

Step 3 S3: attaching the quantum dot photoconversion film on a corresponding blue light display device and a surface of an array substrate.

Wherein, the step 2 of forming the pixel definition layer on the color film substrate, defining the pixel definition layer as the interval to form the pixel definition regions, ink droplet printing the quantum dot particles into the pixel definition regions by inkjet printing technology, curing thereof by ultraviolet light, and completing the preparation of the quantum dot photoconversion film comprises forming an uplift layer and a light-shielding layer covering the uplift layer on a surface of the color film substrate, and laminating the uplift layer and the light-shielding layer to form a pixel definition layer, and a thickness of the pixel definition layer is greater than or equal to 6 μm.

Figure 4:
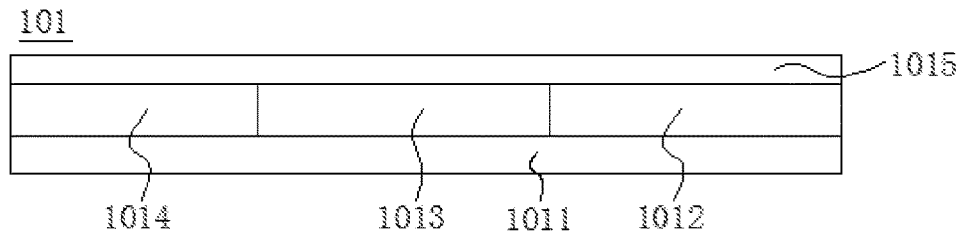
FIG. 4 is a schematic preparation structural diagram of a color film substrate in the quantum dot display panel provided by the present disclosure.
Figure 5:
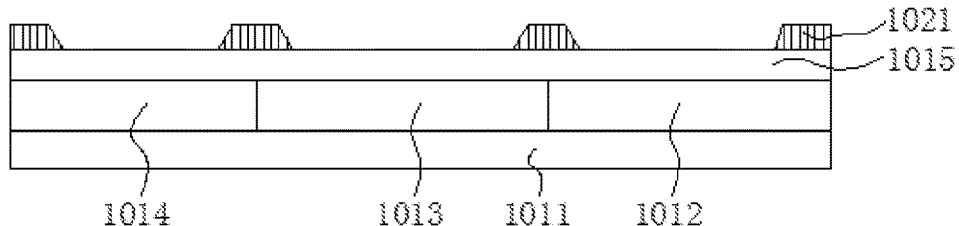
FIG. 5 is a schematic preparation structural diagram of an uplift layer in the quantum dot display panel provided by the present disclosure.
Figure 6:
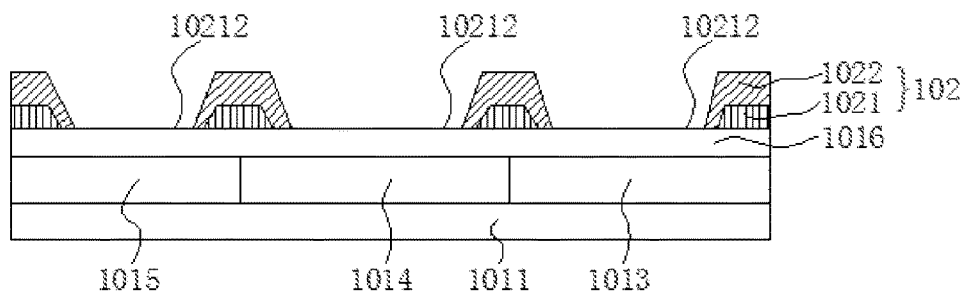
FIG. 6 is a schematic preparation structural diagram of a light-shielding layer in the quantum dot display panel provided by the present disclosure.
Figure 7:
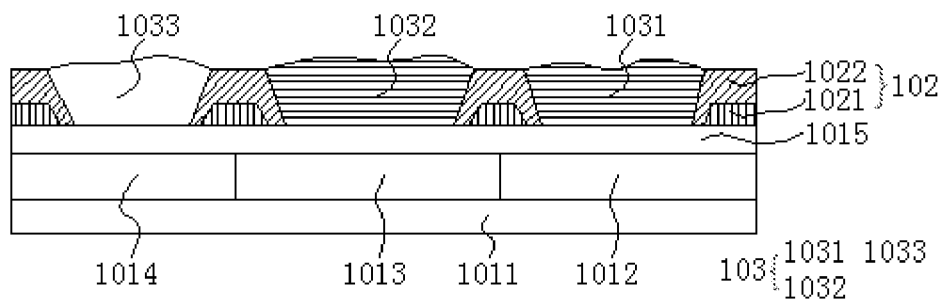
FIG. 7 is a schematic preparation structural diagram of a quantum dot photoconversion film in the quantum dot display panel provided by the present disclosure.
Figure 8:
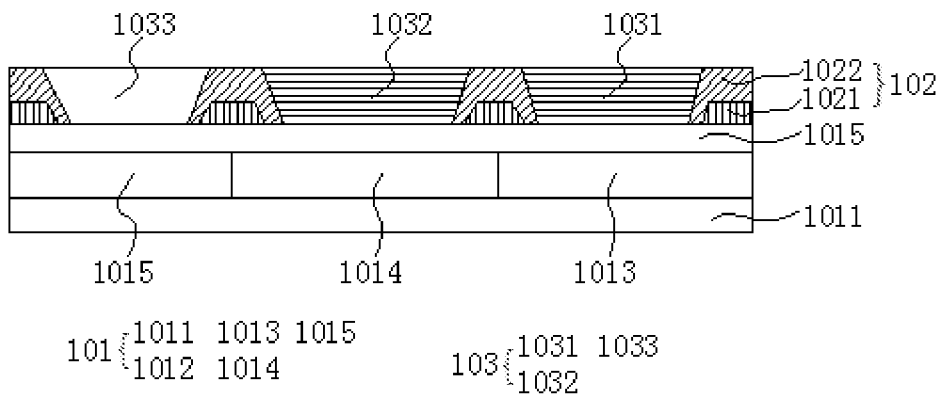
FIG. 8 is a schematic cured structural diagram of the quantum dot photoconversion film in the quantum dot display panel provided by the present disclosure.
Figure 9:
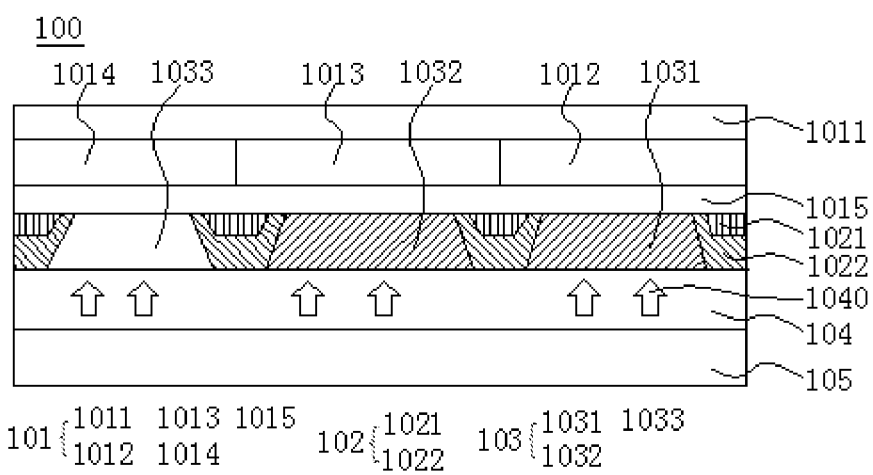
FIG. 9 is a schematic preparation structural diagram of the quantum dot display panel provided by the present disclosure.

Specifically, as shown FIG. 4 to FIG. 9, Step 1 shown in FIG. 4 is that the base substrate 1011 is provided and the color resistance layer is formed on the base substrate 1011. The color resistance layer is divided into a red, green, and blue (RGB) color resistance, no black matrix is set between any two adjacent RGB color resistances, and the color resistance layer comprises a red sub-color resistance 1012, a green sub-color resistance 1013, and a blue sub-color resistance 1014. An organic protection layer 1015 is formed on the color resistance layer, and the organic protection layer is made of a transparent organic film or an optically transparent adhesive. Therefore, a preparation of the color film substrate 101 is completed. Step 2 shown in FIG. 5 and FIG. 6 is that the uplift layer 1021 and the light-shielding layer 1022 covering the uplift layer 1021 are formed on the color film substrate 101, and the uplift layer 1021 and the light-shielding layer 1022 are laminated to form the pixel definition layer 102. The pixel definition layer 102 is preferably an isosceles trapezoid. The pixel definition layer 102 is separately arranged to form pixel definition regions 10212. A specific manufacturing method of the pixel definition layer 102 is as follows, a layer of a SiN film, a SiO film, or an organic layer is coated on the organic protection layer 1015, and the SiN film, a SiO film, or the organic layer is patterned through photomasks to form the uplift layer 1021. A photoresist layer is coated on the organic protection layer 1015, the photoresist layer is patterned through photomasks to form a groove, and the groove is located on a surface of the uplift layer 1021. A layer of black matrix material is deposited in the groove to form the light-shielding layer 1022; or a layer of the SiN film, the SiO film, or the organic layer is coated on the organic protection layer 1015, and the SiN film, a SiO film, or an organic film is patterned through photomasks to form the light-shielding layer 1022, and the light-shielding layer 1022 covers the uplift layer 1021. Wherein, a sum of a thickness of the uplift layer 1021 and the light-shielding layer 1022 is greater than or equal to 6 µm. As shown in FIG. 7 and FIG. 8, the quantum dot particles are ink drop printed to different pixel definition regions 10212 by inkjet printing technology to form a first quantum dot photoconversion film 1031, a second quantum dot photoconversion film 1032, and a third quantum dot photoconversion film 1033. The first quantum dot photoconversion film 1031 is arranged opposite to the red sub-color resistance 1012, the second quantum dot photoconversion film 1032 is arranged opposite to the green sub-color resistance 1013, and the third quantum dot photoconversion film 1033 is arranged opposite to the blue sub-color resistance 1015. The third quantum dot photoconversion film 1033 is vacant, and is set without the quantum dot particles and cured by ultraviolet light. The first quantum dot photoconversion film 1031, the second quantum dot photoconversion film 1032, and the third quantum dot photoconversion film 1033 shrink, and boundaries thereof seamlessly fit on the pixel definition layer 102. Step 3 shown in FIG. 9 is that the quantum dot photoconversion film 103 is attached on the corresponding blue light display device 104 and the corresponding array substrate 105.

The present disclosure provides a quantum dot display panel and a manufacturing method thereof. The quantum dot display panel in the present disclosure comprises a color film substrate, a pixel definition layer located on a surface of the color film substrate, a quantum dot photoconversion film located in pixel definition regions of the pixel definition layer, and a blue light display device located under the quantum dot photoconversion film. Because the pixel definition layer is set with an uplift layer and a light-shielding layer, a thickness of the pixel definition layer is ensured to be greater than or equal to 6 µm, which is beneficial to uniform curing of quantum dots in the quantum dot photoconversion film and seamlessly fit on sides of the pixel definition layer, and prevents the quantum dot display panel from light mixing and light leakage. Blue light source emitted from the blue light display device excites the quantum dot photoconversion film to emit pure light, and the pure light passes through color resistance and becomes corresponding colors, resulting in achieving a softer, more uniform, and brighter output light and increasing color gamut and viewing angles of display devices, thereby improving display quality of the quantum dot display panel.

As mentioned above, while the present disclosure has been disclosed via preferred embodiments as above, the preferred embodiments are not intended to limit the disclosure. Those skilled in the art can make various modifications and alternations without departing from the spirit and scope of the disclosure. The scope of protection of the disclosure is defined by the claims.

What is claimed is:
1. A quantum dot display panel, comprising:
 a color film substrate comprising a base substrate and a color resistance layer located on a surface of the base substrate, wherein the color resistance layer is divided into a red, green, and blue (RGB) color resistance, and no black matrix is set between adjacent RGB color resistances;
 a pixel definition layer, wherein the pixel definition layer comprises an uplift layer and a light-shielding layer covering the uplift layer, and a lamination layer of the uplift layer and the light-shielding layer is located between the adjacent RGB color resistances and arranged opposite to the RGB color resistance to form pixel definition regions in an array;
 a quantum dot photoconversion film formed in the pixel definition regions; and
 an array substrate and a blue light display device located on the array substrate, wherein the color film substrate and the array substrate are arranged in pairs, and the blue light display device is arranged opposite to the quantum dot photoconversion film;
 wherein an organic protection layer is disposed between the color film substrate and the pixel definition layer, and the organic protection layer is made of a transparent organic film or an optically transparent adhesive.

2. The quantum dot display panel as claimed in claim 1, wherein the quantum dot display panel is a top emission structure, and the color film substrate, the quantum dot photoconversion film, the blue light display device, and the array substrate are sequentially disposed along a light-emitting direction.

3. The quantum dot display panel as claimed in claim 1, wherein the uplift layer is a SiN film, a SiO film, or an organic film, and the light-shielding layer is a black matrix.

4. The quantum dot display panel as claimed in claim 3, wherein a thickness of the lamination layer of the uplift layer and the light-shielding layer is greater than or equal to 6 µm.

5. The quantum dot display panel as claimed in claim 1, wherein a cross-section of the pixel definition regions is an isosceles trapezoid, and the quantum dot photoconversion film is attached to two sides of the isosceles trapezoid.

6. The quantum dot display panel as claimed in claim 1, wherein each of the RGB color resistances on the quantum dot display panel and corresponding light-emitting layers of the blue light display device thereof define a sub-pixel.

7. The quantum dot display panel as claimed in claim 6, wherein the color resistance layer is the B color resistance, and the quantum dot photoconversion film corresponding to the B color resistance is set without quantum dot particles.

8. The quantum dot display panel as claimed in claim 1, wherein the blue light display device is an organic light-emitting diode (OLED) display device or a mini light-emitting diode (mini-LED) display device.

9. A quantum dot display panel, comprising:
   a color film substrate comprising a base substrate and a color resistance layer located on a surface of the base substrate, wherein the color resistance layer is divided into a red, green, and blue (RGB) color resistance, and no black matrix is set between adjacent RGB color resistances;
   a pixel definition layer disposed on a surface of the color film substrate and arranged opposite to the RGB color resistance to form pixel definition regions in an array; and
   a quantum dot photoconversion film formed in the pixel definition regions;
   wherein the pixel definition layer comprises an uplift layer and a light-shielding layer covering the uplift layer, and a lamination layer of the uplift layer and the light-shielding layer is located between the adjacent RGB color resistances;
   wherein an organic protection layer is disposed between the color film substrate and the pixel definition layer, and the organic protection layer is made of a transparent organic film or an optically transparent adhesive.

10. The quantum dot display panel as claimed in claim 9, wherein the quantum dot display panel comprises an array substrate and a blue light display device located on the array substrate, the color film substrate and the array substrate are arranged in pairs, and the blue light display device is arranged opposite to the quantum dot photoconversion film.

11. The quantum dot display panel as claimed in claim 10, wherein the blue light display device is an organic light-emitting diode (OLED) display device or a mini light-emitting diode (mini-LED) display device.

12. The quantum dot display panel as claimed in claim 10, wherein the quantum dot display panel is a top emission structure, and the color film substrate, the quantum dot photoconversion film, the blue light display device, and the array substrate are sequentially disposed along a light-emitting direction.

13. The quantum dot display panel as claimed in claim 9, wherein a thickness of the lamination layer of the uplift layer and the light-shielding layer is greater than or equal to 6 μm.

14. The quantum dot display panel as claimed in claim 9, wherein a cross-section of the pixel definition regions is an isosceles trapezoid, and the quantum dot photoconversion film is attached to two sides of the isosceles trapezoid.

15. The quantum dot display panel as claimed in claim 9, wherein each of the RGB color resistances on the quantum dot display panel and corresponding light-emitting layers of the blue light display device thereof define a sub-pixel.

16. The quantum dot display panel as claimed in claim 15, wherein the color resistance layer is the B color resistance, and the quantum dot photoconversion film corresponding to the B color resistance is set without quantum dot particles.

17. A manufacturing method of a quantum dot display panel, comprising following steps:
   step 1: providing a base substrate, forming a color resistance layer on the base substrate, and completing a preparation of a color film substrate;
   step 2: forming an organic protection layer made of a transparent organic film or an optically transparent adhesive on the color resistance layer, forming a pixel definition layer on the organic protection layer, defining the pixel definition layer as an interval to form pixel definition regions, ink droplet printing quantum dot particles into the pixel definition regions by inkjet printing technology, curing thereof by ultraviolet light, and completing a preparation of a quantum dot photoconversion film; and
   step 3: attaching the quantum dot photoconversion film on a corresponding blue light display device and a surface of an array substrate.

18. The manufacturing method of the quantum dot display panel as claimed in claim 17, wherein the step 2 of forming the organic protection layer made of the transparent organic film or the optically transparent adhesive on the color resistance layer, forming the pixel definition layer on the organic protection layer, defining the pixel definition layer as the interval to form the pixel definition regions, ink droplet printing the quantum dot particles into the pixel definition regions by inkjet printing technology, curing thereof by ultraviolet light, and completing the preparation of the quantum dot photoconversion film comprises:
   forming an uplift layer and a light-shielding layer covering the uplift layer on a surface of the organic protection layer, and laminating the uplift layer and the light-shielding layer to form a pixel definition layer, wherein a thickness of the pixel definition layer is greater than or equal to 6 μm.

* * * * *